(12) United States Patent
Kim et al.

(10) Patent No.: US 7,186,446 B2
(45) Date of Patent: Mar. 6, 2007

(54) PLASMA ENHANCED ALD OF TANTALUM NITRIDE AND BILAYER

(75) Inventors: Hyungjun Kim, Lagrangeville, NY (US); Andrew J. Kellock, Sunnyvale, CA (US); Stephen M. Rossnagel, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 10/699,226

(22) Filed: Oct. 31, 2003

(65) Prior Publication Data

US 2005/0095443 A1   May 5, 2005

(51) Int. Cl.
*H05H 1/24* (2006.01)
(52) U.S. Cl. ..................... 427/569; 427/576
(58) Field of Classification Search ............... 427/569, 427/576
See application file for complete search history.

(56) References Cited

U.S. PATENT DOCUMENTS

| | | | |
|---|---|---|---|
| 5,919,531 A * | 7/1999 | Arkles et al. | 427/576 |
| 6,139,922 A * | 10/2000 | Kaloyeros et al. | 438/758 |
| 6,375,693 B1 * | 4/2002 | Cote et al. | 51/308 |
| 6,579,786 B2 | 6/2003 | Schmidbauer et al. | |
| 6,638,810 B2 * | 10/2003 | Bakli et al. | 438/240 |
| 6,641,899 B1 * | 11/2003 | Colburn et al. | 428/209 |
| 6,780,772 B2 * | 8/2004 | Uzoh et al. | 438/690 |
| 6,838,722 B2 * | 1/2005 | Bhalla et al. | 257/301 |
| 6,900,539 B2 | 5/2005 | Motoyama | |
| 6,936,906 B2 * | 8/2005 | Chung et al. | 257/486 |

| | | |
|---|---|---|
| 2004/0009307 A1 | 1/2004 | Koh et al. |

FOREIGN PATENT DOCUMENTS

| | | |
|---|---|---|
| KR | 2002-0065245 | 8/2002 |
| KR | 2003-0001068 | 1/2003 |
| WO | WO03/023835 | 3/2003 |

OTHER PUBLICATIONS

Kim et al., Diffusion barrier properties of transition metal thin films grown by plasma-enhanced atomic layer deposition, J. Vac.Sci. Technol. B 20(4), J/A 2002.
Kim et al., Growth kinetics and initial stage growth during plasma-enhanced Ti atomic layer deposition, J. Vac. Sci. Technol. A 20(3), May/Jun. 2002.
Rossnagel et al.,Plasma-enhanced atomic layer deposition of Ta and Ti for inter-connect diffusion barriers, J. Vac. Sci. Technol. B 18(4), Jul./Aug. 2002.
Atomic Layer Deposition (ALD) 2002 American Vacuum Society Topical Conference, Aug. 19-21, 2002, Hanyang University, Korea, Program Schedule and Content.
H. Kim & S.M. Rossnagel, "The Growth and Properties of PE-ALD Ta and TaN Thin Films" (Invited lecture), Atomic Layer Deposition (ALD) 2002 American Vacuum Society Topical Conference, Aug. 19-21, 2002, Hanyang University, Korea, Abstract.
H. Kim & S.M. Rossnagel, "The Growth and Properties of PE-ALD Ta and TaN Thin Films" (Invited lecture), Atomic Layer Deposition (ALD) 2002 American Vacuum Society Topical Conference, Aug. 19-21, 2002, Hanyang University, Korea, Presentation Slided.

* cited by examiner

*Primary Examiner*—Bret Chen
(74) *Attorney, Agent, or Firm*—Daniel P. Morris; David Aker

(57) ABSTRACT

A method to deposit TaN by plasma enhanced layer with various nitrogen content. Using a mixture of hydrogen and nitrogen plasma, the nitrogen content in the film can be controlled from 0 to N/Ta=1.7. By turning off the nitrogen flow during deposition of TaN, a TaN/Ta bilayer is easily grown, which has copper diffusion barrier properties superior to those of a single Ta layer or a single TaN layer.

15 Claims, 9 Drawing Sheets

PLASMA ENHANCED ALD OF TANTALUM NITRIDE AND BILAYER

FIELD OF THE INVENTION

This invention relates to electrical interconnection structures. More particularly, it relates to "back end of the line" (BEOL) interconnections in high performance integrated circuits, and diffusion barriers used in such devices.

BACKGROUND OF THE INVENTION

In view of the fact that copper has higher electromigration resistance, and thus reliability, as well as higher conductivity than aluminum wiring, copper interconnects are being widely accepted as standard interconnect technology in semiconductor device fabrication. However, for successful implementation of copper interconnect technology, proper diffusion barrier materials with high thermal stability, low resistivity, and low reactivity with copper are essential since copper has higher diffusivity than aluminum and copper easily diffuses through dielectrics, producing deep level defects which are detrimental to the performance of CMOS transistors. It is for this reason that a thin tantalum/tantalum nitride (Ta/TaN) bilayer is usually used as a diffusion barrier to encapsulate the copper lines and vias used with copper interconnect features. Currently ionized physical vapor deposition (I-PVD) is the conventional deposition technique used for the formation of these Ta/TaN layers. However, the use of PVD technologies for these layers is not expected to be applicable for technologies using nodes smaller than approximately 45 nanometers due to limited ability of the deposited films to conform to these smaller features.

Recently, as an alternative deposition technique, atomic layer deposition (ALD) has been widely studied. Due to the inherent atomic level control and self-saturation chemistry, the films formed by ALD are highly conformal and uniform. While it is possible to deposit metallic Ta films using ALD with a halide tantalum precursor, the ALD of Ta and TaN as a bilayer has been only rarely successful for two reasons. First, the conventionally available ALD of TaN using an inorganic source (such as $TaCl_5$), reacted with ammonia ($NH_3$) has been reported to produce a highly resistive phase of tantalum nitride, the $Ta_3N_5$ phase, which presents practical difficulties for the use of these films as barriers in conducting circuits. Second, while it is possible to deposit TaN films using a metal-organic Ta source such as, for example, TBTDET (tertbutylimidotris(diethylamido)tantalum), it is impossible to use this precursor for the deposition of a metallic Ta film by ALD since the TaN bond cannot be reduced in this chemical system.

Tantalum plasma enhanced ALD (PE-ALD) using chlorides and atomic hydrogen as the metal precursor and reagent has been developed recently. An excellent explanation of ALD and apparatus for performing ALD may be found in Plasma-Enhanced Atomic Layer Deposition of Ta and Ti For Interconnect Diffusion Barriers by S. M. Rossnagel, J. Vac. Sci. Technol. B18(4), July/August 2000, which is incorporated herein by reference in its entirety.

SUMMARY OF THE INVENTION

It is therefore an aspect of the present invention to provide a method for producing a copper diffusion barrier that is reliable.

It is another object of the invention to provide a copper diffusion barrier that is made up of materials of relatively high purity, and in particular materials that are carbon free.

The present invention is directed to a novel and simple method for depositing a tantalum nitride layer with controllable nitrogen content and a tantalum nitride/tantalum barrier using PE-ALD. Low resistivity cubic tantalum nitride thin films may be grown by plasma-enhanced atomic layer deposition (PE-ALD) using a tantalum halide, such as $TaCl_5$ as the metal precursor and a hydrogen/nitrogen plasma. The deposition can be performed by alternate exposures of $TaCl_5$ and a plasma composed of a mixture of hydrogen and nitrogen or the consecutive exposure of hydrogen plasma and nitrogen plasma. The nitrogen content in the films can be controlled from a nitrogen to tantalum ratio of 0 up to 1.7 by changing nitrogen partial pressure during the second, reactant step of the ALD sequence. A bilayer (or multilayer) of tantalum nitride/tantalum can be deposited by simply switching off the nitrogen flow following the deposition of tantalum nitride. This bilayer shows good copper diffusion barrier properties.

Thus, the invention is directed to a method for forming a tantalum nitride layer on a substrate comprising depositing the layer on the substrate by plasma enhanced atomic layer deposition of a tantalum halide precursor in the presence of a hydrogen plasma and a nitrogen plasma. Preferably, the tantalum halide precursor is tantalum pentachloride. The method further comprises varying concentration of nitrogen plasma to thereby vary the amount of nitrogen in the layer. The concentration of nitrogen plasma may be varied so that the layer has a nitrogen to tantalum concentration ratio of between 0 and 1.7. The method may further comprise reducing the concentration of nitrogen plasma to zero so that a substantially nitrogen free layer of tantalum is formed. Thus, the concentration of nitrogen is other than zero for a first period of time, and the concentration of nitrogen plasma is essentially zero for a second period of time, so that a first layer of tantalum nitride is formed and a second layer of substantially nitrogen free tantalum is formed. The combination of the first layer and the second layer can used as a diffusion barrier for copper. Preferably, the second layer is deposited upon the first layer.

During deposition, the temperature of the substrate is between 100° C. and 400° C., and may be 300° C.

The layer is deposited on a substrate selected from the group consisting of silicon, silicon having a layer of silicon dioxide on the silicon and other dielectric materials which have low dielectric constants including porous dielectrics. The low dielectric constant substrates may have a dielectric constant in the range of 2.0 to 3.0. The substrate may have copper conductors.

In accordance with the invention, the deposition may comprise exposing the substrate to the tantalum halide carried by an inert gas; exposing the substrate to the hydrogen and nitrogen plasma; and repeating these steps, for example, for a total of 40 to 250 times, until a desired thickness of the layer of, for example, 2 to 10 nanometers is obtained. The exposure of the substrate to the tantalum halide carried by the inert gas may be performed at a pressure of $3.0 \times 10^{-2}$ Torr. During the exposure of the substrate to the hydrogen and nitrogen plasma, the partial pressure of hydrogen may be $2.5 \times 10^{-2}$ Torr. The exposure of the substrate to the tantalum halide carried by the inert gas may be carried out for approximately 2 seconds; and exposure of the substrate to the hydrogen and nitrogen plasmas may be carried out for approximately 5 seconds. The substrate may be simultaneously or sequentially exposed to the nitrogen plasma and the hydrogen plasma.

The invention is also directed to an article of manufacture comprising a substrate; and a bilayer of tantalum nitride and tantalum on the substrate, each of the tantalum nitride and the tantalum being substantially free of carbon. Preferably, the tantalum layer comprises amorphous tantalum. Also preferably the tantalum is disposed on the tantalum nitride.

BRIEF DESCRIPTION OF THE DRAWINGS

These and other aspects, features, and advantages of the present invention will become apparent upon further consideration of the following detailed description of the invention when read in conjunction with the drawing figures, in which.

DESCRIPTION OF THE INVENTION

Figure 1:
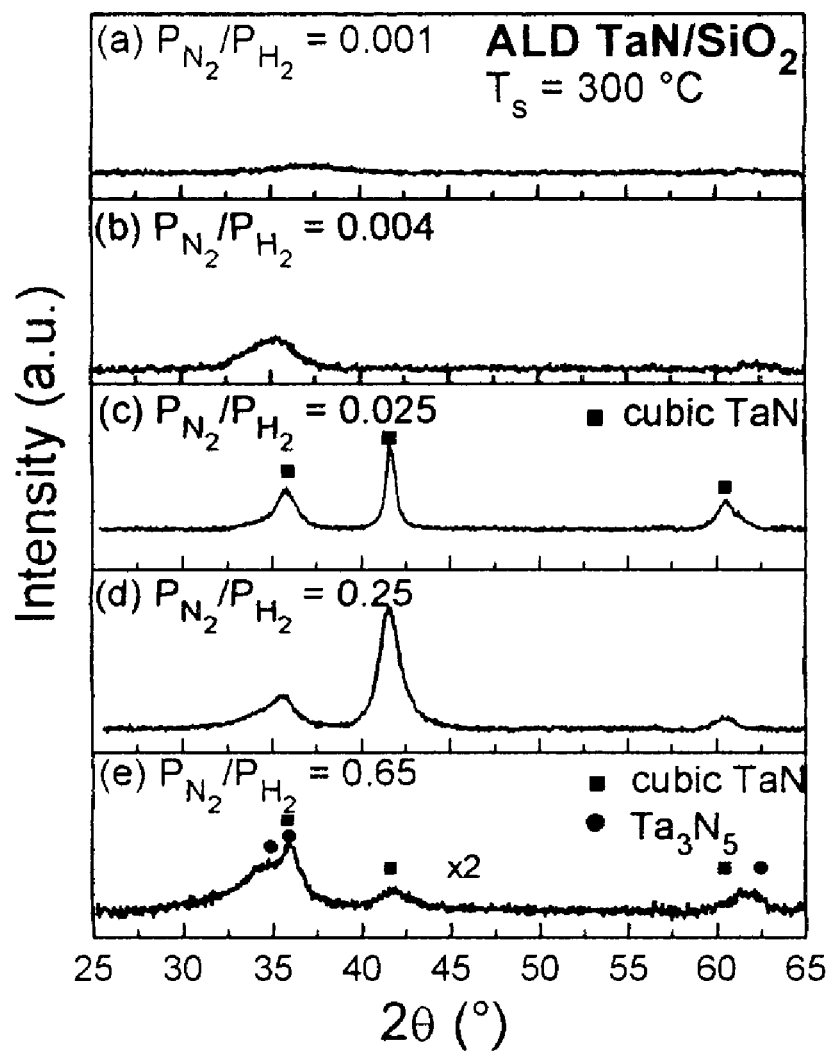
FIG. 1 shows a series of graphs of x-ray diffraction data (intensity verses angle) for TaNx layers deposited by PE-ALD at various ratios of partial pressure of nitrogen to partial pressure of hydrogen.

Variations described for the present invention can be realized in any combination desirable for each particular application. Thus particular limitations, and/or embodiment enhancements described herein, which may have particular advantages to the particular application need not be used for all applications. Also, it should be realized that not all limitations need be implemented in methods, systems and/or apparatus including one or more concepts of the present invention.

An apparatus which may be used to perform the method in accordance with the invention is described in the above mentioned paper entitled Plasma-Enhanced Atomic Layer Deposition of Ta and Ti For Interconnect Diffusion Barriers by S. M. Rossnagel, J. Vac. Sci. Technol. B18(4), July/August 2000. As noted above the teachings of this paper are incorporated herein by reference in their entirety.

Sample sizes as large as, for example, but not by way of limitation, 200 mm in diameter are loaded into a commercially available or non-commercial ALD chamber. The chamber is pumped by a reactive-gas grade turbo molecular vacuum pump with a working base pressure of $10^{-7}$ Torr.

The sample may be heated using a heater such as a ceramic resistive heating plate, providing growth temperatures as high as, for example, but not by way of limitation 450° C. The temperature can be controlled by changing current to the heater, which can be initially calibrated against a thermocouple attached to the sample.

A solid $TaCl_5$ (powder) source contained in a glass tube can be used as the metal precursor. Although $TaCl_5$ may be used as the halide precursor for Ta, other Ta halides including $TaF_5$, $TaI_5$, and $TaBr_5$ may also be used. The glass tube can be maintained at 100° C. to develop adequate vapor pressure. All the delivery lines are preferably heated to between 130° C. and 150° C. to prohibit condensation of the precursor. To improve the delivery, argon can be used as a carrier gas, with the flow being controlled by, for example, a leak valve upstream from the tube containing the source.

Atomic hydrogen and activated nitrogen may be generated by a quartz tube connected to the sample chamber via, for example, a gate valve. Hydrogen and nitrogen gases may be supplied via, for example, a leak valve. The quartz tube may be wrapped with a multiple-turn coil carrying radio frequency energy at 13.56 MHz, with a power level of, for example, up to 1200 watts. Preferably, the gate valve is used between the sample chamber and the tube region so that the precursor is not exposed to the tube region. Optical emission spectroscopy may be used to monitor the generated radicals. Large atomic H peaks are observed for H plasma, while only $N_2^+$ related peaks for N plasma, indicating that the active precursor for N is activated molecular nitrogen rather than atomic N. This difference between H and N may be due to the higher dissociation energy of molecular nitrogen.

The deposition cycle comprises the following steps: exposing the substrate to $TaCl_5$ carried by Ar gas, evacuating the chamber, opening the hydrogen and nitrogen source valves and initiating the RF plasma for a set time, and shutting off the hydrogen and nitrogen source and plasma, allowing the chamber to return to base pressure. Before the cycle begins, the partial pressure of hydrogen and nitrogen were set using leak valves. This cycle ideally results in the complete reaction of the adsorbed $TaCl_5$ layer, and the deposition of a fraction of a monolayer of TaN. For Ta PE-ALD, the same process is used, with no nitrogen and the nitrogen valve closed.

While silicon or silicon dioxide substrates are used for deposition, poly-silicon substrates are used for copper diffusion barrier property measurement. However, the invention is not limited to the use of silicon or silicon dioxide substrates. Deposition may be performed on various substrates, such as metals including Cu, Ta, TaN, Ru, W and dielectrics such as SiCO, MSQ (methyl silsesquioxane), HSQ (hydrogen silsesquioxane) based low k, or high k oxides including $HfO_2$, $ZrO_2$. For this purpose, an ultra-high vacuum (UHV) direct current (DC) magnetron sputtering chamber connected through a load lock chamber may be used for the deposition of sputtered copper films on the ALD films without breaking vacuum. An in-situ resistivity and optical scattering measurement system may be used for diffusion barrier temperature determination. Annealing can be performed at, for example, 3° C./s up to 1000° C. in a helium environment.

EXAMPLE

Tantalum nitride films are grown typically with $TaCl_5$ exposure time of 2 seconds and plasma exposure time of 5 seconds, which correspond to saturation condition of ALD.

This saturation is due to the self-limited adsorption of the precursor. The total time for one cycle is typically 12 seconds including the evacuation time after $TaCl_5$ and plasma exposures. The hydrogen partial pressure during exposure is set as $2.5 \times 10^{-3}$ Torr and nitrogen partial pressure is changed. The total pressure (argon and TaCls vapor) during $TaCl_5$ exposure is constant at $3.0 \times 10^{-2}$ Torr. A typical number of cycles is 50–800 to produce tantalum nitride films with thicknesses in the range of 20 to 400 Angstroms, depending upon growth conditions.

FIG. 1 illustrates X-ray diffraction (XRD) results of PE-ALD TaNx grown at $T_s=300°$ C. At low nitrogen partial pressure (nitrogen to hydrogen partial pressure ratio=0.001), the XRD spectrum shows a broad peak at approximately $2\theta=38°$. For a higher partial pressure ratio (0.004), the broad peak shifts to a lower $2\theta$ value, indicating the formation of other phases. The hump in the diffraction peak at approximately 34° C. can be indexed as $Ta_2N$ (100) ($2\theta=33.9680$) or hexagonal TaN (110) (curve b, $2\theta=34.528°$). It is difficult to discern the difference due to the large width of the peak.

With further increasing nitrogen partial pressure above a partial pressure ratio of 0.025, well-distinguished cubic TaN peaks are observed (111 peak at $2\theta=35.876°$ and 200 peak at $2\theta=41.638°$). This indicates that the PE-ALD TaN films are composed of polycrystalline grains in contrast to PE-ALD Ta films grown at similar temperature. High resolution transmission electron microscope (TEM) observation also show well defined lattice fringes for the TaN films. Diffraction peaks of other phases such as hexagonal TaN, $Ta_5N_6$, or $Ta_3N_5$ were not observed for partial pressure ratio up to $P_{N2}/P_{H2}=0.25$. Above $P_{N2}/P_{H2}=0.5$ additional features begin to appear at approximately $2\theta=35°$, which can be indexed as a higher N content phase such as $Ta_3N_5$ (004 or 040 peak at $2\theta=34.939°$) or $Ta_5N_6$ (040 or 110 peak at $2\theta=34.629°$).

Figure 2:
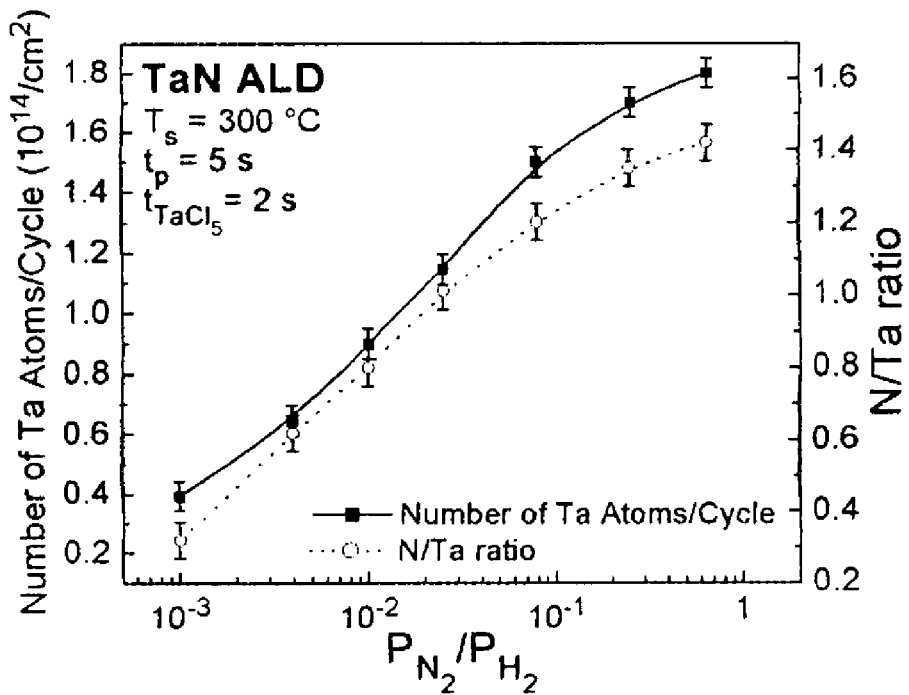
FIG. 2 is a graph which shows nitrogen content and growth rate of TaNx layers deposited by PE-ALD as a function of the ratio of partial pressure of nitrogen to partial pressure of hydrogen.

In FIG. 2, the nitrogen content of the TaN films was determined by Rutherford Backscattering Spectrometry (RBS). The results are shown as a function of partial pressure ratio between nitrogen and hydrogen ($P_{N2}/P_{H2}$) for the films grown at $T_s=300°$ C. With increasing $P_{N2}/P_{H2}$ from 0.001 to 1, the N/Ta ratio of grown TaN films was changed from 0.3 to 1.4. These results together with XRD analysis mentioned above indicate that the cubic TaN films are grown at the partial pressure ratio between 0.7 and 1.3. Stoichiometric TaN was obtained at $P_{N2}/P_{H2}=0.025–0.035$. The stoichiometry of TaN can be controlled since atomic H extracts the Cl atoms while the N is incorporated from activated nitrogen. This ability to change the stoichiometry has potential benefits for PE-ALD of TaN. With increasing $P_{N2}/P_{H2}$ from 0 to 1, the N/Ta ratio of grown TaN films is changed from 0 (Ta) to 1.7.

The number of Ta atoms incorporated during one cycle obtained by RBS, corresponding to the growth rate, is also plotted as a function of partial pressure ratio $P_{N2}/P_{H2}$ in FIG. 2. FIG. 2 shows that the growth rate increases continuously, and linearly, with increasing nitrogen partial pressure. The number of tantalum atoms deposited per cycle at the stoichiometric composition was $1.0 \times 10^{14}/cm^2$.

Figure 3:
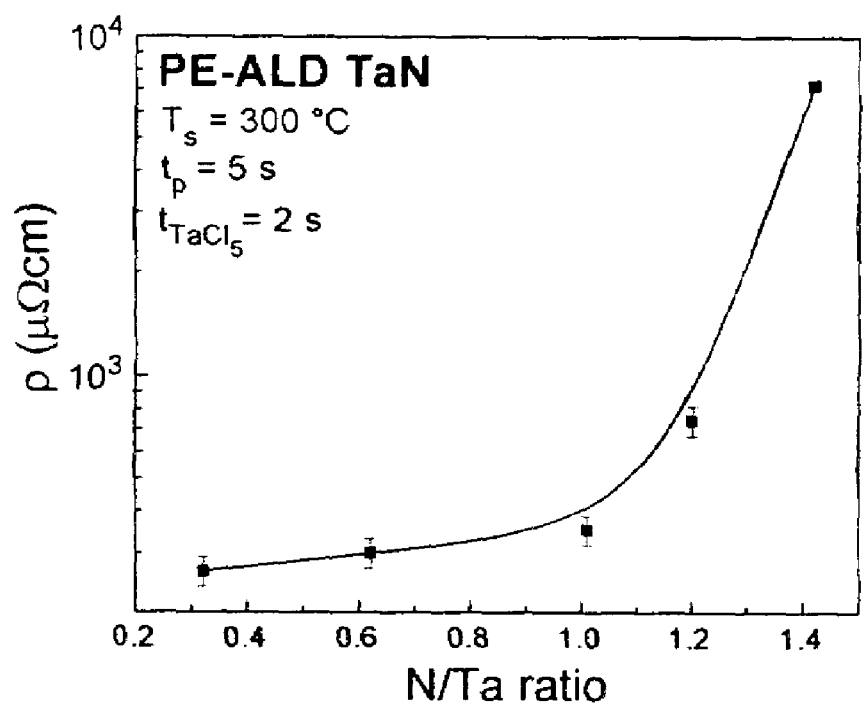
FIG. 3 is a graph of the resistivity of TaNx layers produced by PE-ALD as a function of the N/Ta ratio.

Referring to FIG. 3, resistivity of the grown TaN is typically 350–400 $\mu\Omega$cm for cubic TaN and overall, resistivity tends to increase with increasing nitrogen concentration. For example, the TaN film grown at $P_{N2}/P_{H2}=0.65$ has resistivity of 7200 $\mu\Omega$cm. The high resistivity may be explained by the formation of a high resistivity $Ta_3N_5$ phase.

Figure 4:
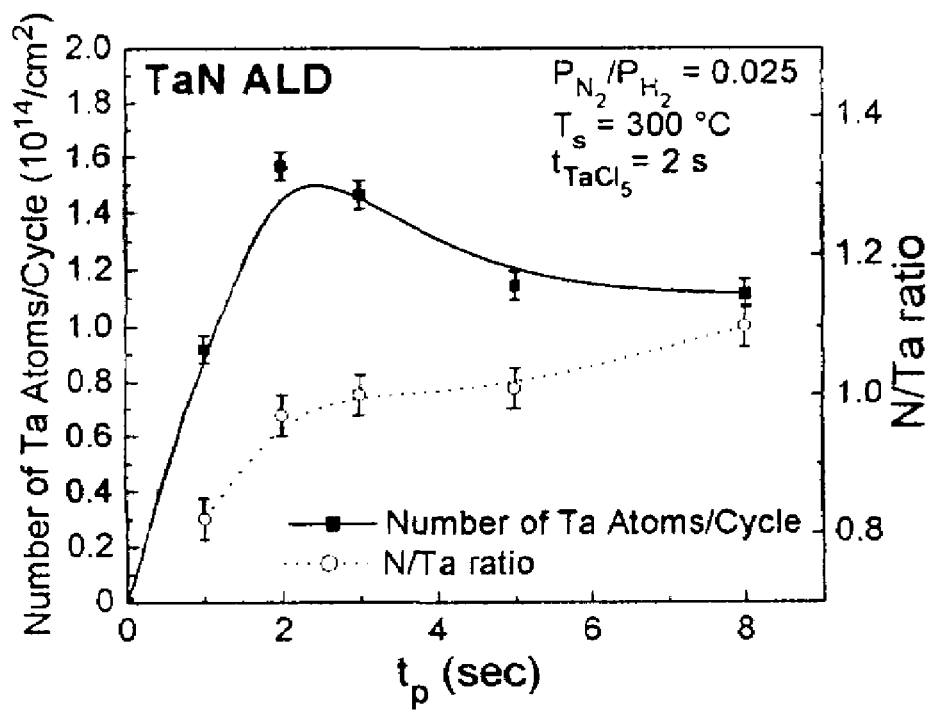
FIG. 4 is a graph which shows nitrogen content and growth rate of TaNx layers deposited by PE-ALD as a function of the plasma exposure time at a given ratio of plasma partial pressures and at a given temperature.

FIG. 4 shows the growth rates and N/Ta ratio of TaN films as a function of plasma exposure time $t_p$. The growth rate increases with increasing plasma exposure until $t_p=2$ seconds then decreases somewhat to saturate above $t_p>4$ seconds. The growth rates as a function of $TaCl_5$ exposure time $T_{TaCl}$ (data not shown) saturate at $T_{TaCl}>1$ second without showing any maximum below saturation. The number of Ta atoms deposited per cycle at saturation condition was $1.2 \times 10^{14}/cm^2$. In addition, the N/Ta ratio in the films tends to increase with $t_p$.

Figure 5:
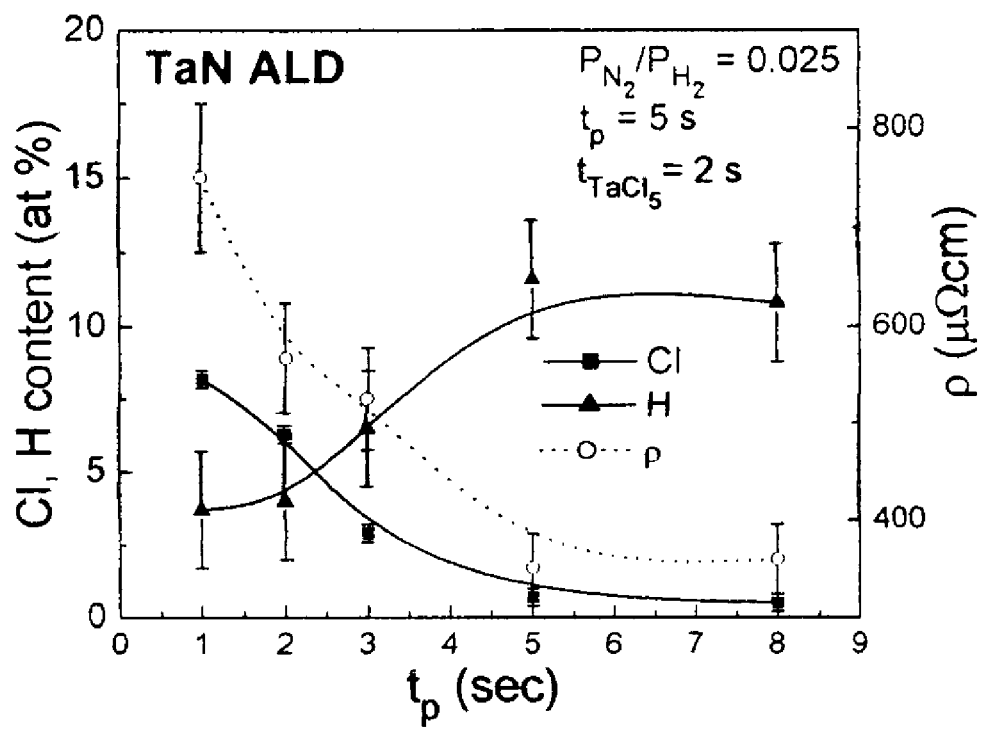
FIG. 5 is a graph which shows chlorine and hydrogen content and resistivity values as a function of the plasma exposure time at a given ratio of plasma partial pressures and at a given temperature.

RBS and FRES (Forward Recoil Elastic Spectrometry) results for the TaN films are shown as a function of $t_p$ in FIG. 5. The Cl content is a strong function of $t_p$, and the resistivity values, shown together, indicate that the growth of films with low Cl and resistivity requires $t_p>5$ seconds. Hydrogen concentration in the films increases with $t_p$, but saturates above 5 seconds. The maximum hydrogen concentration was approximately 11%.

The oxygen content for the films grown at saturation condition was typically between 5–10%, independent of growth temperatures. However, the oxygen content shows a tendency to increase with decreasing film thickness. In addition, the sheet resistance values of very thin films (especially below 100 Å) increase by up to 5–10% after exposure to the air. These results imply that the oxygen is incorporated by air exposure rather than during growth. For TaN films capped with copper without an air break, detailed analysis by RBS shows that the oxygen content is below detection limit (5%) inside the films. Oxygen was only detected at the interface region, supporting that the oxygen is incorporated by air exposure. No carbon was detected by RBS, within a detection limit of 5 at %.

Figure 6:
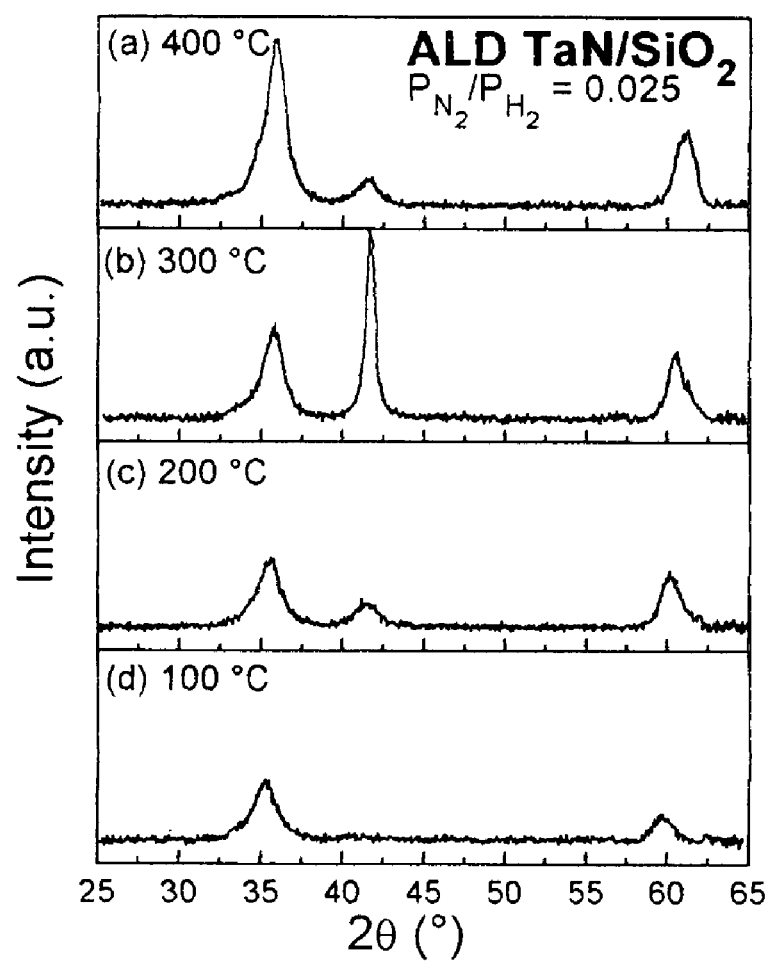
FIG. 6 shows a series of graphs of x-ray diffraction data (intensity verses angle) at various growth temperatures.

The effect of growth temperature during PE-ALD TaN is studied in the range of $T_s=100–400°$ C. The XRD spectra of the TaN films grown at different temperatures are shown in FIG. 6. All spectra show only cubic TaN related peaks, although the intensity ratio between 111 and 200 peaks depends on growth temperature. At even the lowest growth temperature of 100° C., the 111 peak is clearly seen.

Figure 7:
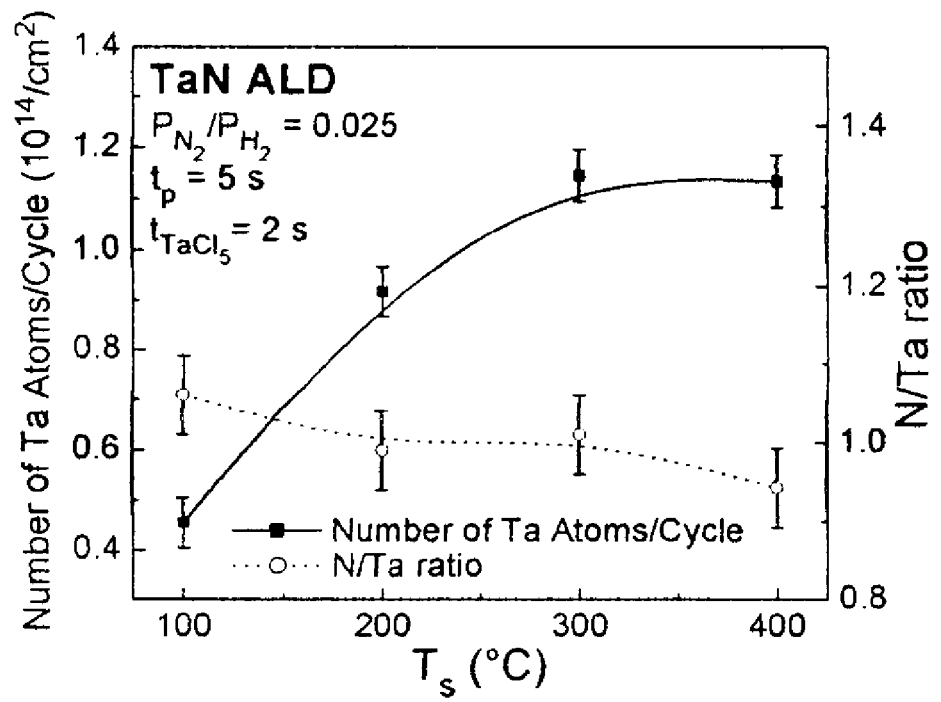
FIG. 7 is a graph which shows nitrogen content and growth rate of TaNx layers deposited by PE-ALD as a function of temperature.

FIG. 7 shows that the N/Ta ratio of the film is almost independent of growth temperature, while the growth rate is strong function of growth temperature. With increasing growth temperature from 100 to 400° C., the growth rate increases by almost a factor of three then saturates above $T_s=300°$ C.

Figure 8:
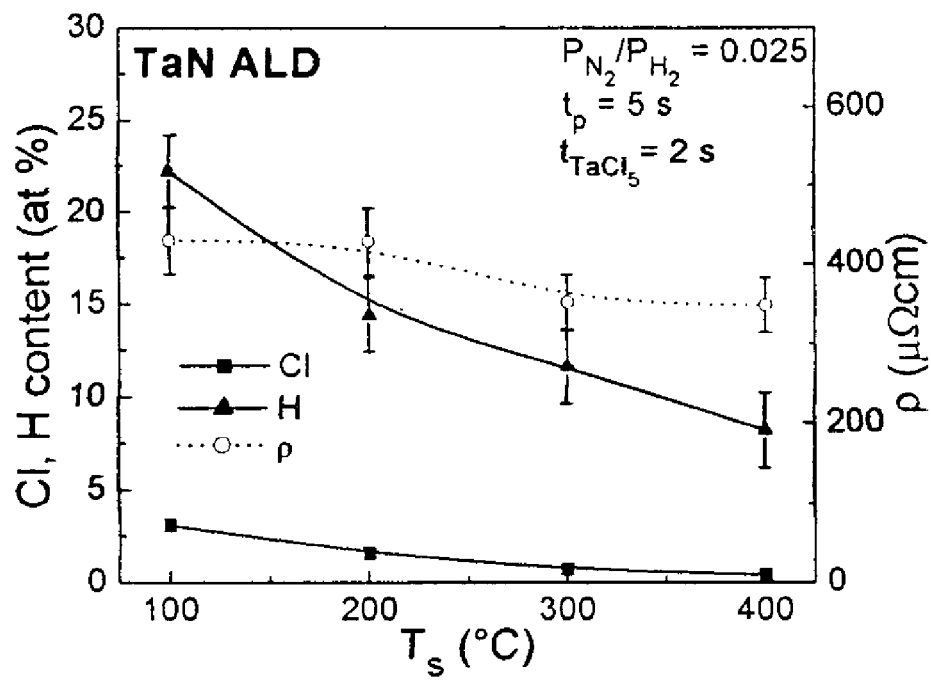
FIG. 8 is a graph which shows chlorine and hydrogen content and resistivity of TaNx layers deposited by PE-ALD as a function of temperature.

FIG. 8 shows the chlorine and hydrogen content and resistivity of TaN films as a function of growth temperature. Both chlorine and hydrogen contents decrease with increasing growth temperature. At typical growth condition (300° C.), chlorine content is below 0.5% and hydrogen content is below 10%. Although the dependence is weaker, the resistivity also decreases with growth temperature. This decrease in resistivity is probably due to the smaller chlorine content for higher growth temperatures.

The discussion above indicates, in summary, that TaNx (x=0 to 1.7) films with various nitrogen content are easily deposited by the present invention. However, in accordance with the invention, a TaN/Ta bilayer is deposited by growing a Ta PE-ALD film on PE-ALD of TaN for desired thickness, such as 25 A. This may be done by simply switching off the nitrogen valve during deposition. For comparison, PE-ALD Ta and TaN films of the same thickness were grown. After a copper PVD capping layer deposition without air exposure, resistivity and optical scattering measurements are performed during annealing for copper diffusion barrier property measurement.

Figure 9:
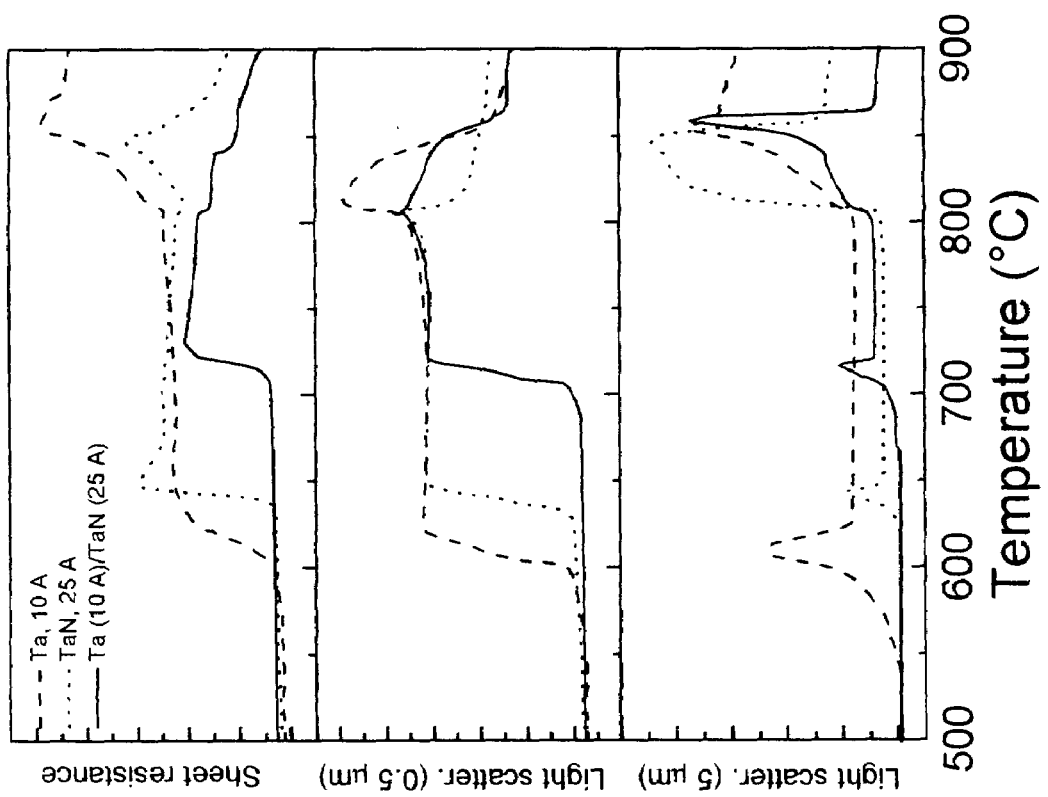
FIG. 9 illustrates copper diffusion barrier failure as a function of annealing temperature for PE-ALD TaN/Ta bilayers.

FIG. 9 shows that the bilayer structure has better diffusion barrier failure temperature than the individual layers. This is partly because the Ta PE-ALD layer has an amorphous structure which contributes to the copper diffusion barrier properties by reducing the number of grain boundaries (Grain boundaries are the predominant copper diffusion mechanism). Further, the inherently better copper diffusion barrier property of the TaN, as opposed to that of a Ta single layer, positively contributes to the resulting diffusion barrier properties. In summary, both the amorphous PE-A/D tantalum layer and PE-ALD tantalum nitride layer positively contribute to the resulting diffusion barrier properties.

The bilayer structure concept can be extended to the deposition of multi-layer structures composed of Ta and TaN. The nitrogen flow can be easily turned on and off. Thus by using simple computer control, a multi-layer structure with a desirable thickness for each layer can be deposited easily. This multi-layer structure can be used as a diffusion barrier, or for other semiconductor related processes. In addition, by changing the number of cycles of each Ta and TaN layer process, the overall control of nitrogen content can be more precisely defined.

It is noted that the foregoing has outlined some of the more pertinent objects and embodiments of the present invention. The concepts of this invention may be used for many applications. Thus, although the description is made for particular arrangements and methods, the intent and concept of the invention is suitable and applicable to other arrangements and applications. It will be clear to those skilled in the art that other modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art. Thus, it should be understood that the embodiments has been provided as an example and not as a limitation. The scope of the invention is defined by the appended claims.

Having thus described our invention, what we claim as new and desire to secure by Letters Patent is as follows:

1. A method for forming a bilayer of tantalum nitride and tantalum on a substrate, the method comprising:
   depositing a first layer on the substrate by plasma enhanced atomic layer deposition of a tantalum halide precursor in the presence of a plasma containing hydrogen and nitrogen; wherein the depositing comprises:
   a. exposing the substrate to the tantalum halide carried by an inert gas;
   b. exposing the substrate to the plasma; and
   c. repeating a. and b. approximately 40–800 times until a desired thickness of the first layer is obtained; and
   depositing a second layer by continuing plasma enhanced atomic layer deposition of a tantalum halide precursor in the presence of a plasma by reducing concentration of nitrogen in the plasma to zero so that a substantially nitrogen free second layer of amorphous tantalum is formed.

2. The method as recited in claim 1, further comprising varying concentration of nitrogen in the plasma to thereby vary the amount of nitrogen in the first layer.

3. The method as recited in claim 2, wherein the concentration of nitrogen plasma is varied so that the first layer has a nitrogen to tantalum concentration ratio of between 0 and 1.7.

4. The method as recited in claim 1, wherein the bilayer is used as a diffusion barrier for copper.

5. The method as recited in claim 1, wherein temperature of the substrate is between 100° C. and 450° C.

6. The method as recited in claim 1, wherein temperature of the substrate is 300° C.

7. The method as recited in claim 1, wherein the bilayer is deposited on a substrate selected from the group consisting of silicon, silicon having a layer of silicon dioxide on the silicon, and a porous substrate.

8. A method as recited in claim 7, wherein the substrate is a low dielectric constant substrate and has a dielectric constant in the range of 2.0–3.0.

9. A method as recited in claim 7, wherein the substrate has copper conductors, and the bilayer serves as a diffusion barrier for said copper.

10. A method as recited in claim 1, wherein the tantalum halide is tantalum pentachloride.

11. A method as recited in claim 1, wherein the exposing of the substrate to the tantalum halide carried by the inert gas is performed at a pressure of $3.0 \times 10^{-2}$ Torr.

12. A method as recited in claim 1, wherein during the exposing of the substrate to the hydrogen and nitrogen plasma, partial pressure of hydrogen is $2.5 \times 10^{-2}$ Torr.

13. A method as recited in claim 1, wherein the exposing of the substrate to the tantalum halide carried by the inert gas is carried out for approximately 2 seconds; and the exposing of the substrate to the hydrogen and nitrogen plasmas is carried out for approximately 5 seconds.

14. The method as recited in claim 1, comprising switching off a source of nitrogen to reduce said concentration of nitrogen in the plasma to zero.

15. The method as recited in claim 1, wherein the first layer and the second layer are sequentially deposited while the substrate is in a chamber by switching off a source of nitrogen to thereby reduce said concentration of nitrogen in the plasma to zero.

* * * * *